United States Patent
Roberts et al.

(10) Patent No.: US 7,284,227 B1
(45) Date of Patent: Oct. 16, 2007

(54) METHOD AND SYSTEM FOR GENERATING IMPLEMENTATION FILES FROM A HIGH LEVEL SPECIFICATION

(75) Inventors: Mark B. Roberts, Auburn, CA (US); Scott K. Roberts, Auburn, CA (US)

(73) Assignee: Xilinx, Inc., San Jose, CA (US)

( * ) Notice: Subject to any disclaimer, the term of this patent is extended or adjusted under 35 U.S.C. 154(b) by 324 days.

(21) Appl. No.: 10/966,993

(22) Filed: Oct. 15, 2004

(51) Int. Cl.
*G06F 17/50* (2006.01)

(52) U.S. Cl. ............................. 716/16; 716/18; 716/10

(58) Field of Classification Search ............... 716/9, 716/10, 13, 14, 16, 18
See application file for complete search history.

(56) References Cited

U.S. PATENT DOCUMENTS

| | | | | |
|---|---|---|---|---|
| 5,295,082 | A * | 3/1994 | Chang et al. ................. | 716/12 |
| 5,414,637 | A * | 5/1995 | Bertin et al. .................. | 716/16 |
| 5,450,022 | A | 9/1995 | New | |
| 5,627,999 | A * | 5/1997 | Cheng et al. .................. | 716/8 |
| 5,808,901 | A * | 9/1998 | Cheng et al. .................. | 716/8 |
| 5,822,214 | A * | 10/1998 | Rostoker et al. ............. | 716/10 |
| 6,099,583 | A * | 8/2000 | Nag ............................. | 716/16 |
| 6,137,307 | A | 10/2000 | Iwanczuk et al. | |
| 6,526,563 | B1 * | 2/2003 | Baxter ......................... | 716/18 |
| 6,567,967 | B2 * | 5/2003 | Greidinger et al. .......... | 716/10 |
| 6,675,361 | B1 * | 1/2004 | Crafts .......................... | 716/2 |
| 6,941,537 | B2 * | 9/2005 | Jessep et al. ................. | 716/15 |
| 2002/0178429 | A1 * | 11/2002 | Nakayama et al. .......... | 716/15 |
| 2005/0132317 | A1 * | 6/2005 | Kolk et al. ................... | 716/11 |
| 2005/0138592 | A1 * | 6/2005 | Morgan et al. .............. | 716/12 |
| 2006/0080631 | A1 * | 4/2006 | Koo ............................. | 716/17 |

OTHER PUBLICATIONS

Kar et al., "Optimizing C4 Bump Placements for a Peripheral I/O Design", 1999 Proceedings of 49th Electronic Components and Technology Conference, Jun. 1, 1999, pp. 250-254.*
Ezawa et al., "Eutectic Solder Bump Process for ULSI Flip Chip Technology", Twenty-First IEEE/CPMT Electronics Manufacturing Technology Symposium, Oct. 13, 1997, pp. 293-298.*
Alander et al., "Solder Bump Reliability-Issues on Bump Layout", IEEE Transactions on Advanced Packaging, vol. 23, No. 4, Nov. 2000, pp. 715-720.*
U.S. Appl. No. 10/618,404, filed Jul. 11, 2003, Young.
U.S. Appl. No. 10/683,944, filed Oct. 10, 2003, Young.

(Continued)

*Primary Examiner*—Phallaka Kik
(74) *Attorney, Agent, or Firm*—Kim Kanzaki; Michael R. Hardaway

(57) ABSTRACT

A method and system for generating from a high-level placement specification the layout and schematic implementation data is disclosed. In addition packaging data and a software model may also be generated. In one embodiment an array of rows and columns is formed on an integrated circuit (IC) in which all elements in a row have the same height and all elements in a column have the same width. This array, which may be displayed in a textual or spreadsheet format, forms the high-level placement specification. A software program of this embodiment converts this high-level placement specification into layout and schematic files that can be used by a commercial CAD tool to produce a file for fabrication.

18 Claims, 13 Drawing Sheets

OTHER PUBLICATIONS

U.S. Appl. No. 10/966,554, filed Oct. 15, 2004, Roberts et al.
Cadence; "Virtuoso Layout Editor"; Datasheet; Copyright 2003; available from Cadence Design Systems, Inc.; Sep. 2003; pp. 1-4.

M. Taliercio et al.; "A Procedural Datapath Compiler for VLSI Full Custom Applications"; IEEE 1991 Custom Integrated Circuits Conference; pp. 22.5.1 to 22.5.4, 1991.

* cited by examiner

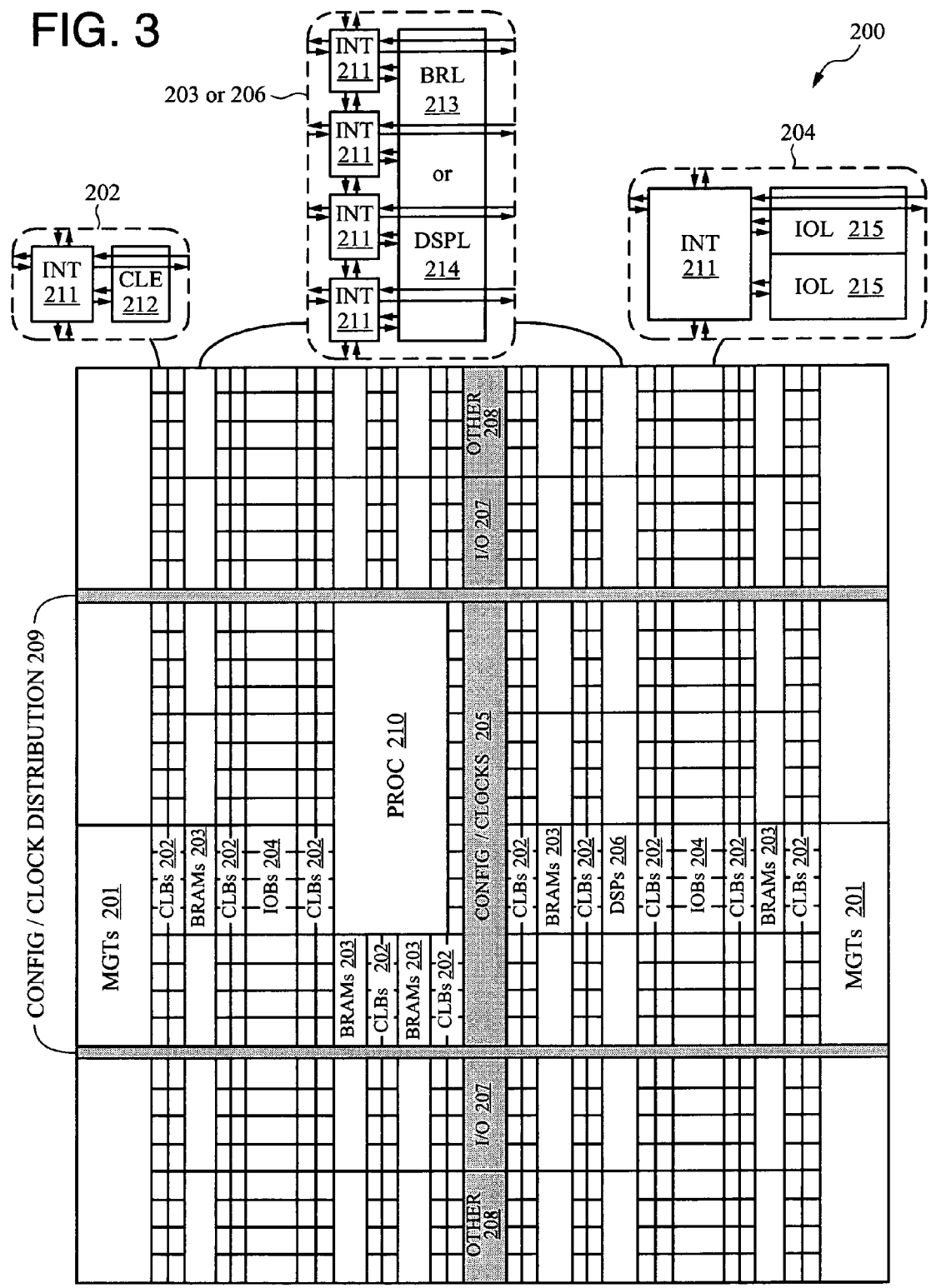

| | 348 | 354 | | 343H | 343J |
|---|---|---|---|---|---|
| | int_term_clk_top | int_term_cfg_top | int_term_ft_top | int_term_clb8x2nb_top | int_term_clb8x2_top |
| dcm_esd_c | clk_term_t | cfg_v_frame_top(1,5) | clb_bufferx8(1,2) | clb8x2nb(1,2) | clb8x2(1,2) |
| dcm_esd_c | clk_dcm_top_u | | | | |
| | clk_hrow | | cfg_hclk_ft | cfg_hclk_clbx2nb_right | cfg_hclk_clbx2_right |
| dcm_esd_c | clk_dcm_top_d | | clb_bufferx8(1,2) | clb8x2nb(1,2) | clb8x2(1,2) |
| dcm_esd_c | clk_dummy2_d(1,3) | | | | |
| | | int_hbrk_cfg | int_hbrk_dummy | int_hbrk_clbx2nb | int_hbrk_clbx2 |
| dcm_esd_c | | cfg_v_frame_top(1,5) | clb_bufferx8(1,2) | clb8x2nb(1,2) | clb8x2(1,2) |
| dcm_esd_abs_top | clk_dcm_top_u | | | | |
| | clk_hrow | | cfg_hclk_ft | cfg_hclk_clbx2nb_right | cfg_hclk_clbx2_right |
| iob_iob16_center_ft(1,2) | clk_iob_top(1,5) | | clb_bufferx8(1,2) | clb8x2nb(1,2) | clb8x2(1,2) |
| | | int_hbrk_cfg | int_hbrk_dummy | int_hbrk_clbx2nb | int_hbrk_clbx2 |
| iob_iob16_center_ft(1,2) | | cfg_v_frame_topcen(1,5) | clb_bufferx8(1,2) | clb8x2nb(1,2) | clb8x2(1,2) |
| | clk_hrow | | cfg_hclk_ft | cfg_hclk_clbx2nb_right | cfg_hclk_clbx2_right |
| cfg_idcode(1,2) | clk_bufgmux(1,5) | | clb_bufferx8(1,2) | clb8x2nb(1,2) | clb8x2(1,2) |
| | | int_hbrk_cfg_center | int_hbrk_dummy | int_hbrk_clbx2nb | int_hbrk_clbx2 |
| cfg_esd_c(1,2) | | cfg_v_frame_botcen(1,5) | clb_bufferx8(1,2) | clb8x2nb(1,2) | clb8x2(1,2) |
| cfg_irsize | | | cfg_hclk_ft | cfg_hclk_clbx2nb_right | cfg_hclk_clbx2_right |
| | clk_hrow | | clb_bufferx8(1,2) | clb8x2nb(1,2) | clb8x2(1,2) |
| iob_iob16_center_ft(1,2) | clk_iob_bot(1,5) | | | | |
| | | int_hbrk_cfg | int_hbrk_dummy | int_hbrk_clbx2nb | int_hbrk_clbx2 |
| | | cfg_v_frame_bot(1,5) | clb_bufferx8(1,2) | clb8x2nb(1,2) | clb8x2(1,2) |
| | clk_hrow | | cfg_hclk_ft | cfg_hclk_clbx2nb_right | cfg_hclk_clbx2_right |
| dcm_esd_abs_bot | clk_dcm_bot_d | | clb_bufferx8(1,2) | clb8x2nb(1,2) | clb8x2(1,2) |
| dcm_esd_c | clk_dummy2_d(1,3) | | | | |
| | | int_hbrk_cfg | int_hbrk_dummy | int_hbrk_clbx2nb | int_hbrk_clbx2 |
| dcm_esd_c | | cfg_v_frame_bot(1,5) | clb_bufferx8(1,2) | clb8x2nb(1,2) | clb8x2(1,2) |
| dcm_esd_c | clk_dcm_bot_u | | | | |
| | clk_hrow | | cfg_hclk_ft | cfg_hclk_clbx2nb_right | cfg_hclk_clbx2_right |
| iob_mon_power_esd_decouple(1,2) | clk_dummy6_b_d | | clb_bufferx8(1,2) | clb8x2nb(1,2) | clb8x2(1,2) |
| | clk_term_b | | | | |
| | int_term_clk_bot | int_term_cfg_bot | int_term_ft_bot | int_term_clb8x2nb_bot | int_term_clb8x2_bot |

```
typedef struct cell_s {
    char*    name;        /* Spreadsheet (block) name. */
    lib_p    lay_lib;     /* Layout library (name). */
    char*    lay_name;    /* Layout cell name. */
    char*    lay_view;    /* Layout view name. */
    int      lay_mirror;
    lib_p    lay_lib2;    /* Alternate library (name). */
    char*    lay_name2;   /* Alternate cell name. */
    char*    lay_view2;   /* Alternate view name. */
    int      lay_mirror2;
    double   lay_width;   /* Layout block width. */
    double   lay_height;  /* Layout block height. */
    double   lay_xoff;    /* Layout block offset in the x direction. */
    double   lay_yoff;    /* Layout block offset in the y direction. */
    lib_p    sch_lib;     /* Schematic library (name). */
    char*    sch_name;    /* Schematic cell name. */
    char*    sch_view;    /* Schematic view name. */
    int      sch_mirror;
    double   sch_width;   /* Schematic block width. */
    double   sch_height;  /* Schematic block height. */
    double   sch_xoff;    /* Schematic block offset in the x dir. */
    double   sch_yoff;    /* Schematic block offset in the y dir. */
    int      cols;        /* Columns used by cell (normally 1). */
    int      rows;        /* Rows used by cell (normally 1). */
    int      direction;   /* Used only by sch pin cells. */
    bump_p   bumps;           /* List of bumps. */
    cell_p   next;        /* Next cell in the data cells list. */
} cell_s;
```

FIG. 7A

```c
typedef struct data_s *data_p;
typedef struct data_s {
    char*         bumpfilename;    /* Skill bumps output file name. */
    char*         layfilename;     /* Skill layout output file name. */
    char*         schfilename;     /* Skill schematic output file name. */
    char*         laylibname;      /* Layout library name. */
    char*         schlibname;      /* Schematic library name. */
    block_p       lay_blocks;      /* List of cells (matched by sch_blocks) */
    block_p       sch_blocks;      /* List of cells (matched by lay_blocks) */
    megacell_p    megacells;
    construct_p   constructs;
    combo_p       combos;
    banklimit_p   banklimits;      /* The max number of pins in each bank. */
    offset_p      block_offsets;
    offset_p      bump_offsets;
    bumpalloc_p   bumpallocs;
    pkgs_p        pkgs;            /* List of packages. */
    part_p        parts;           /* List of parts. */
    cell_p        cells;           /* List of cells (referenced by part inst). */
    cell_p        lay_cells;       /* List of final layout bump cells. */
    cell_p        sch_cells;       /* List of final schematic pin cells. */
    lib_play_libs;                 /* List of lay libs (referenced by cells). */
    lib_psch_libs;                 /* List of sch libs (referenced by cells). */
    list_p        bumps;           /* List of bump types (in bump_alloc). */
    int           addr_base;       /* Number of cells in the addr_cell array. */
    int           addr_bits;       /* Number of digits in each address. */
    int           addr_inst;       /* Current addr instance number. */
    double        addr_lay_spx;    /* Layout addr cell spacing in the x dir. */
    double        addr_sch_spx;    /* Schem addr cell spacing in the x dir. */
    char*         addr_last;       /* Name of last 5th bit address cell. */
    char*         addr_notlast;    /* Name of notlast 5th bit address cell. */
    list_p        addr_nolast;     /* List of cells that do not use a last. */
    addrcells_p   addr_cells;      /* List of names of address cells. */
    addr_list_p   addr_lists;      /* List of addr cells. */
    double        opt_lay_spy;     /* Y spacing between option cells for lay. */
    double        opt_sch_spy;     /* Y spacing between option cells for schem */
    opt_p         opt_cells;       /* Available cells for placement */
    iob_p         iob_cells;       /* IOB cells to place opt cells into */
    prop_p        props;           /* List of string variables. */
    variable_p    variables;       /* List of numeric variables. */
    layer_p       blocking_layers; /* List of blocking layers used in dieseal. */
    time_t        time;            /* Timestamp used in headers. */
    char*         date;            /* Date string corresponding to time stamp. */
    stats_p       stats;           /* List of cells to keep statistics on. */
    template_p    templates;       /* List of templates. */
    instname_p    instnames;       /* List of unique instance names. */
    list_p        notes;           /* List of header notes. */
} data_s;
```

FIG. 7B

METHOD AND SYSTEM FOR GENERATING IMPLEMENTATION FILES FROM A HIGH LEVEL SPECIFICATION

REFERENCE TO A COMPUTER PROGRAM LISTING APPENDIX

This application includes a computer program-listing appendix on a single compact disc, the contents of which are incorporated herein by reference in their entirety. The compact disc contains a first 10 KB file entitled "4vfx20.txt" created Jun. 9, 2004, a second 236 KB file entitled "dgen.c_excerpts.txt" created Sep. 20, 2004, a third 7 KB file entitled "4vfx12.txt" created Jul. 1, 2004, a fourth 3 KB file entitled "4vfx20.combos.txt" created Jun. 9, 2004, a fifth 26 KB file entitled "4vfx20.con.txt" created Jun. 9, 2004, a sixth 3 KB file entitled "4vfx20.in.txt" created Jul. 1, 2004, a seventh 16 KB file entitled "4vfx20.sw.txt" created Jul. 2, 2004, an eighth 4,112 KB file entitled "4vfx20_lay.il.txt" created Jul. 2, 2004, a ninth 265 KB file entitled "4vfx20_sch.il.txt" created Jul. 2, 2004, a tenth 99 KB file entitled "4vfx20ff252.pkg" created Sep. 20, 2004, an eleventh 12 KB file entitled "4vlx25.txt" created Jul. 1, 2004, a twelfth 18 KB file entitled "4vsx35.txt" created Jul. 1, 2004, a thirteenth 2 KB file entitled "ff252.txt" created Sep. 17, 2004, a fourteenth 4 KB file entitled "inc_addr.file.txt" created Jul. 2, 2004, a fifteenth 23 KB file entitled "inc_bank.limits.txt" created Jun. 9, 2004, a sixteenth 3 KB file entitled "inc_block.offsets.txt" created Jun. 9, 2004, a seventeenth 33 KB file entitled "inc_blocks.define.txt" created Jul. 2, 2004, an eighteenth 119 KB file entitled "inc_bumps.file.txt" created Jun. 9, 2004, a nineteenth 8 KB file entitled "inc_job.options.txt" created Jul. 2, 2004, and a twentieth 3 KB file entitled "inc_stats.define.txt" created Jun. 9, 2004. A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to computer aided design of integrated circuits (ICs).

BACKGROUND

The use of Computer Aided design (CAD) tools in the design of application specific integrated circuits (ASICs) is well-known. Despite the use of CAD tools there is still much manual effort in taking a high level specification of an ASIC and producing the detailed physical layout, circuit schematics, and packaging.

These CAD tools have been used to produce programmable logic devices (PLDs) such as field programmable gate arrays (FPGAs). For example, in order to produce the standard STREAM file that is sent to the foundry to produce the FPGA, schematics and layouts are first created manually via a graphics tool. These schematics and layouts are then combined with a FPGA specific cell library using a commercially available Virtuoso custom design platform diagram from Cadence Inc. of San Jose, Calif., to produce the STREAM file (a binary file of the layout in the GDS2 format).

FIG. 1 is a simplified schematic view of a conventional FPGA 48. The FPGA includes a programmable fabric 2 surrounded by an I/O ring 4. The programmable fabric 2 includes configurable logic block (CLB) columns 5, block random access memory (BRAM) columns 6, and a digital signal processing (DSP) column 7. The I/O ring 4 includes input/output blocks (IOBs) and multi-gigabit transceiver (MGT) blocks (not shown). A programmable interconnect structure (not shown in FIG. 1) allows the circuit elements or blocks in the programmable fabric to be interconnected with each other and with the circuit elements or blocks in the I/O ring 4.

Traditionally, the design time to produce the layout, schematic, and package files for FPGA 48 has been relatively long. A modification in the number and type of the columns in the programming fabric 2, or the size of the FPGA or the package type used also required relatively long redesign time.

Thus there is a need for improving the process of producing the detailed physical layout, circuit schematics, and packaging of an IC from a high level specification.

SUMMARY

The present invention relates generally to a method and system for generating from a high-level placement specification the layout and schematic implementation data. In addition packaging data and/or software modeling data may also be generated. In one exemplary embodiment an array of rows and columns is formed on an integrated circuit (IC) in which most elements in a row have substantially the same height and most elements in a column have substantially the same width. This array, which may be formed in a textual or spreadsheet format, forms the high-level placement specification. A software program of this embodiment converts this high-level placement specification into layout and schematic files that can be used by a commercial CAD tool to produce a file for fabrication. In addition the software program may also receive package pin list information, which the program uses to generate device packaging data.

One embodiment of the present invention includes a system using a computer for laying out blocks from a common specification. The system includes: a high level block placement specification, e.g., a spreadsheet, stored in a computer readable medium, having a description of blocks arranged in rows and columns, wherein substantially all blocks in a row are of substantially equal height and substantially all blocks in a column are of substantially equal width; a bump placement specification for selected blocks; and software configured to lay out the plurality of blocks and to place one or more bumps on each selected block using the high level block placement specification and the bump placement specification.

Another embodiment of the present invention includes a method for creating a package file for an integrated circuit. First, a grid is formed having a plurality of blocks. Next, a height and a width is determined for each block. Then at least one bump is placed on a block and a corresponding package pin is assigned to the at least one bump. Lastly, the package file is outputted.

Yet another embodiment of the present invention includes software code stored in a computer readable medium for creating implementation files for a programmable logic device (PLD). The software code includes: code for receiving an array of rows and columns, where the array has a plurality of blocks, wherein each block is placed in an intersection of a row and a column; code for receiving data for setting a height for each row and a width for each column; code for determining a height, a width and a coordinate for each block; code for placing at least one bump on a block; code for assigning to the at least one bump a corresponding package pin; and code for outputting a package file, a layout file, a software model file, and a schematic file.

A further embodiment of the present invention includes a system using a computer for creating implementation files for a programmable logic design. The system includes: a spreadsheet, displayed on a computer display, having an assignment of a plurality of blocks to spreadsheet cells, wherein substantially all blocks in a row of the spreadsheet are of substantially equal height and substantially all blocks in a column of the spreadsheet are of substantially equal width; a blocks definition file defining layout height and width for a block; and a software program configured to generate a layout implementation file based on input from the spreadsheet and blocks definition file.

It will be appreciated that various other embodiments are set forth in the Detailed Description and Claims which follow.

BRIEF DESCRIPTION OF THE DRAWINGS

FIG. 3 illustrates FPGA architecture of another embodiment of the present invention that includes a large number of different programmable tiles;

FIGS. 4A and 4B are simplified diagrams of a FPGA in accordance with another embodiment of the present invention;

FIGS. 5A-5C is a spreadsheet showing the high-level block placement for part of a FPGA of an embodiment of the present invention;

FIGS. 7A and 7B show two examples of common data structures of an embodiment of the present invention;

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

In one exemplary embodiment of the present invention, the integrated circuit (IC) is divided into an array of multiple rows and multiple columns. The intersection of a row and a column includes a block, where the block has one or more circuit components or elements. most blocks (to substantially all blocks) in a column have the same physical width and most blocks (to substantially all blocks) in a row have the same physical height. Two columns do not necessarily have the same width and two rows do not necessarily have the same height. A mega-block, i.e., a set of adjacent blocks, may be used to accommodate a multi-block application specific circuit, for example, a microprocessor. Note while examples are given of PLDs and in particular FPGAs, these are merely illustrative and the invention is applicable to any IC which has cells that can be arranged in an array (which may occupy some or all of the IC), where all cells in a column have the same physical width and all cells in a row have the same physical height.

Figure 5A:
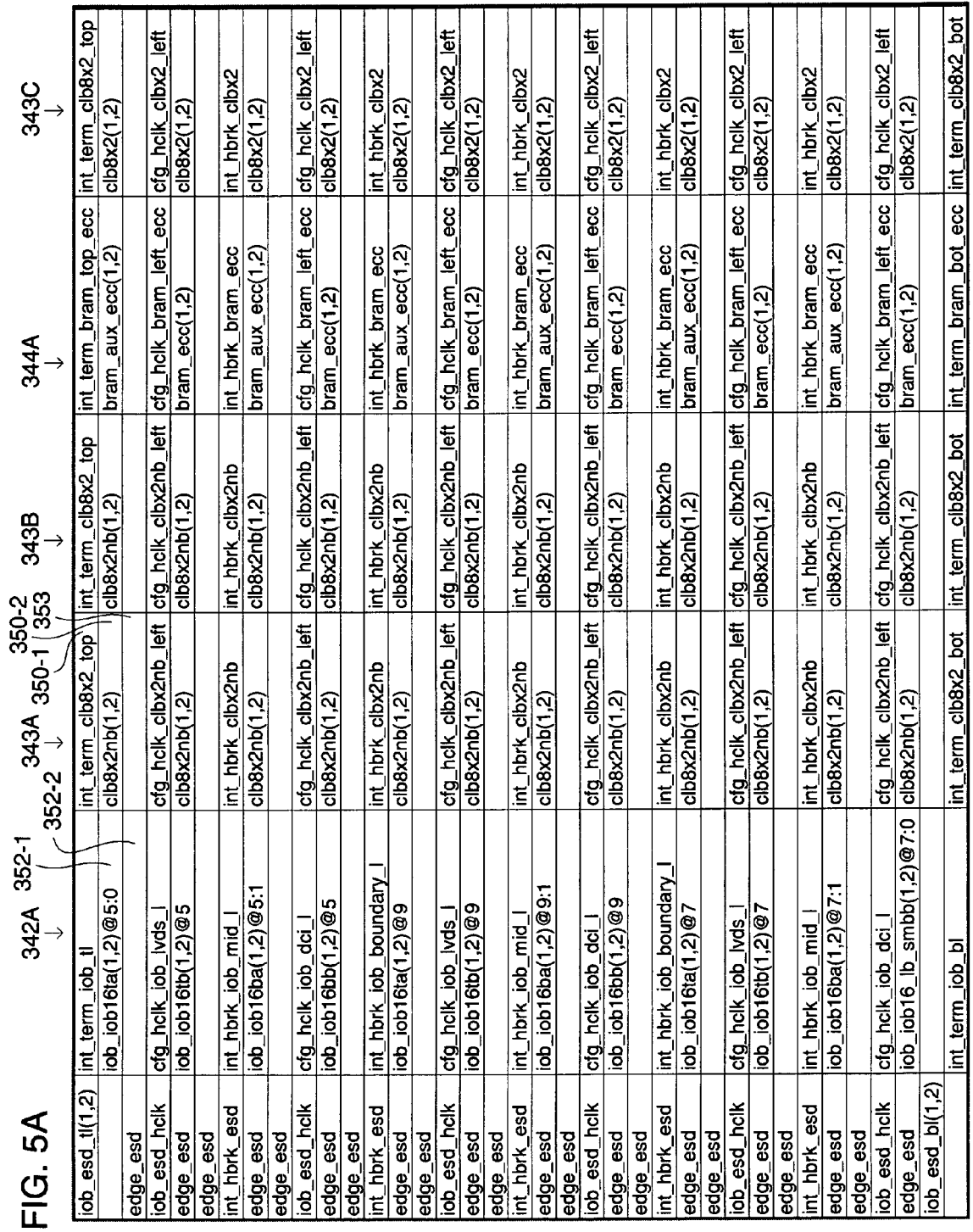
Figure 5B:
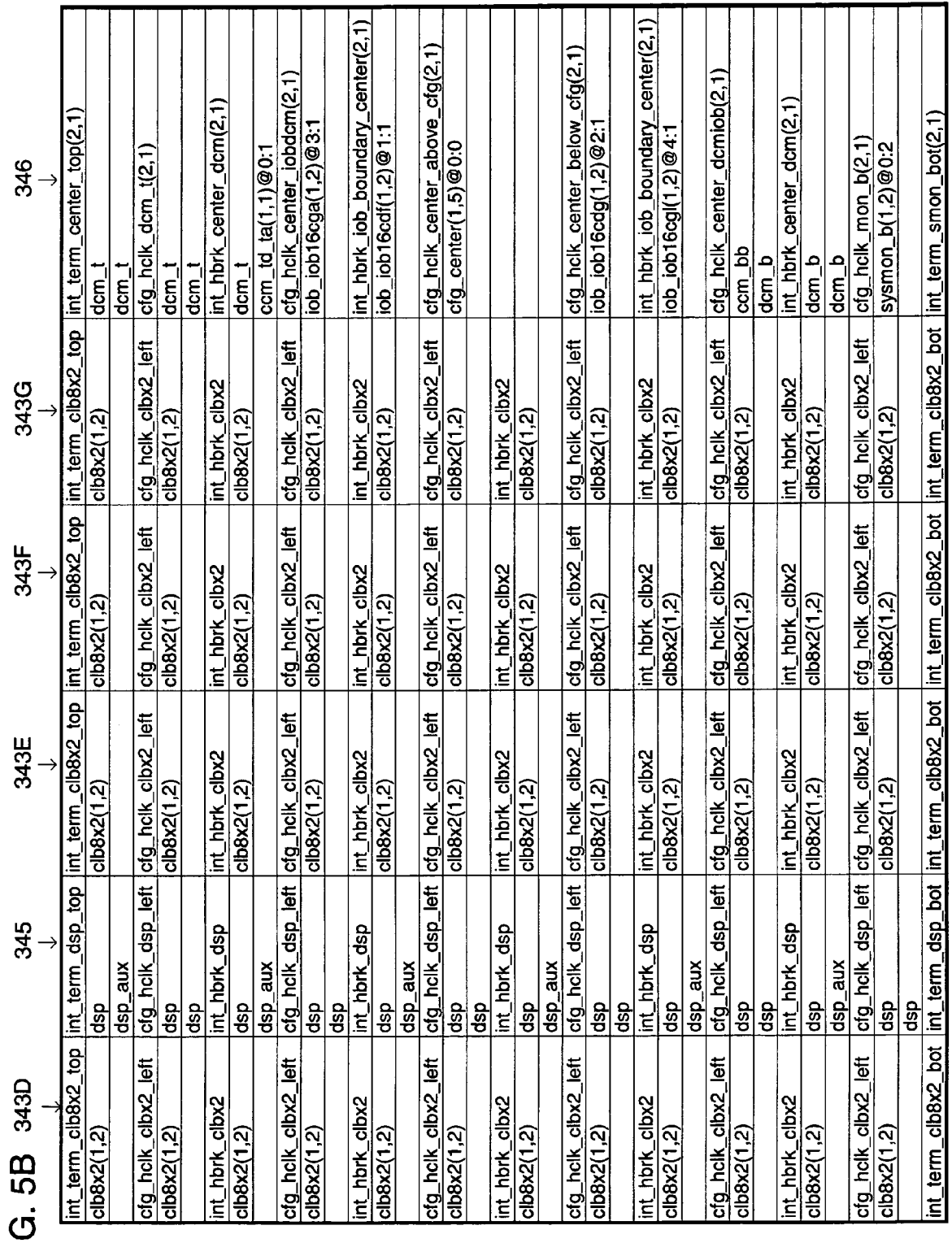

In this exemplary embodiment a high level block placement specification placing the blocks is formed by the user. This high level block placement specification can have many forms. For example a spreadsheet such as shown in FIGS. 5A-5C can be used to place some of the blocks. A textual description having a line of codes for each row (or column), for example, "t.4.i.4.b.4.d.4.o.4.b.4.i.4.t", can alternatively be used to place the blocks per row (or column). In yet another example the textual description having a line of codes can first be used and a PERL script used to expand the codes to produce the spreadsheet.

One major advantage of using, for example, a spreadsheet is that columns (and/or rows) can be easily moved, added or subtracted, or modified. In a columnar architecture (e.g., FIGS. 2, 3, and 4A/B), laying out a new IC with a different mix of column types can be done in substantially less time than can be conventionally done.

Further in this embodiment a design generator software program (for example, dgen.c_excerpts.txt in the Appendix) uses this high level placement specification along with detailed block and bump placement information for each block type to produce layout and schematic implementation data, for example, SKILL files. This implementation data is used, in a well-known process, by a commercial CAD tool, for example the Virtuoso custom design platform from Cadence Inc., along with a cell library provided by the user, to produce the GDSII Stream data (which may be used for electron beam lithography and photo mask production of the IC).

In addition the pin list for a particular package can be input into the design generator software program and the bumps mapped to the pins. A package file can be produced such that the manufactures IC can be easily packaged. A software model may also be produced for simulation and verification.

Thus, generally, from one high level specification the files needed to manufacture, package and simulate the IC design are generated by one software program (which may or may not be distributed in one or more sections of code). The software program uses common data structures which allow for the sharing of information in generating the different output files. The common data structures are stored in a computer readable medium. In an alternative embodiment the common data structures are stored in a database (DB), which may include a flat file. This is an improvement over prior art where the same data had to be entered in different locations, hence increasing the possibility of error and implementation time, especially if there was a change in the data.

The regular structure of the array and of the block types allows for parameterization of data describing the blocks in an embodiment of the present invention. For example, the block (or cell) placement including offset values, can be done using algebraic equations and/or variables. A block width in a column can, for example, be given by a variable which is set in a common location. A block location in a row/column intersection in the array, can be given, for example, by an algebraic equation using the center point of the row/column intersection and an (x,y) offset, where the offset is set in a common location. This algebraic representation of block or cell placement allows for easy updates. In an alternative embodiment a more general functional representation, i.e., f(x,y), may be used.

In an embodiment of the present invention, one or more templates are used to place the bumps associated with, for example, the IOBs or MGTs in a PLD. The use of templates or bump allocation templates rather than individual bump placement, both reduces implementation time as well as the possibility of error.

Other improvements of an embodiment of the present invention include the automatic placement of address decoding circuitry for the circuit components in a block, and having an IOB specification that describes the different IOL circuit options. For example, between two H clock (hclk) rows there are 8 CLBs (see for example FIGS. 3 and 4A/B). In the hclk row are the two sets of address decoder circuits to address each of the 8 CLBs (each set has four address decoder circuits). The software program places these address decoder circuits automatically.

For the two blocks having the 16 IOLs between two hclk rows (see for example FIGS. 3 and 4A/B), each IOL 215 can be separately specified in an IOB specification that is read and implemented by the software program. Thus each IOB block or pair of blocks can be given an IOB type name. Using the IOB type name, the description of the 16 IOLs can be looked up in, for example, an IOB options file. Modifications to the IOLs associated with an IOB type name can be done in one location with the software program automatically placing the 16 IOLs and associated bumps.

Figure 2:
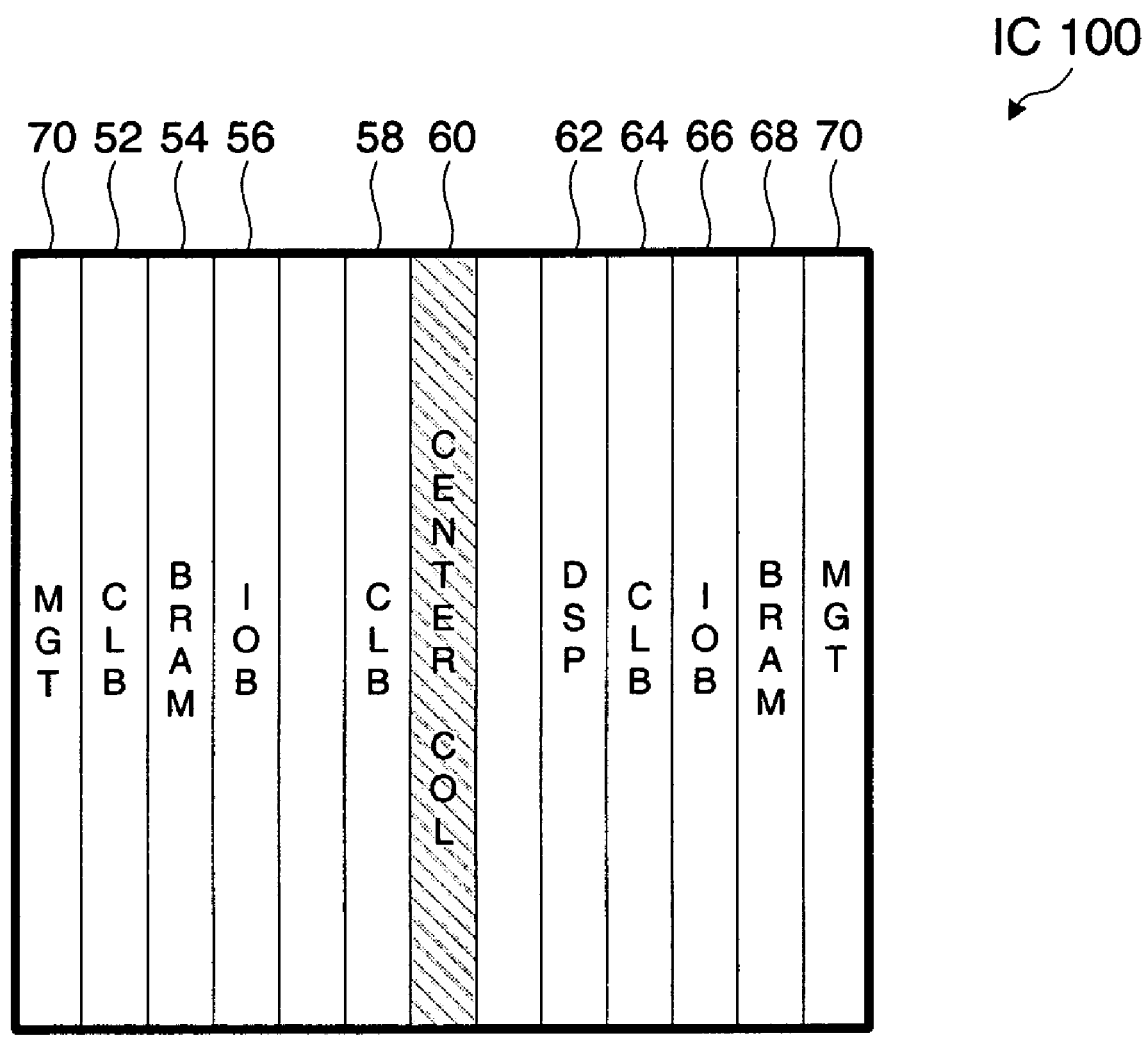
FIG. 2 is a simplified diagram of an IC in accordance with one embodiment of the present invention.
Figure 4A:
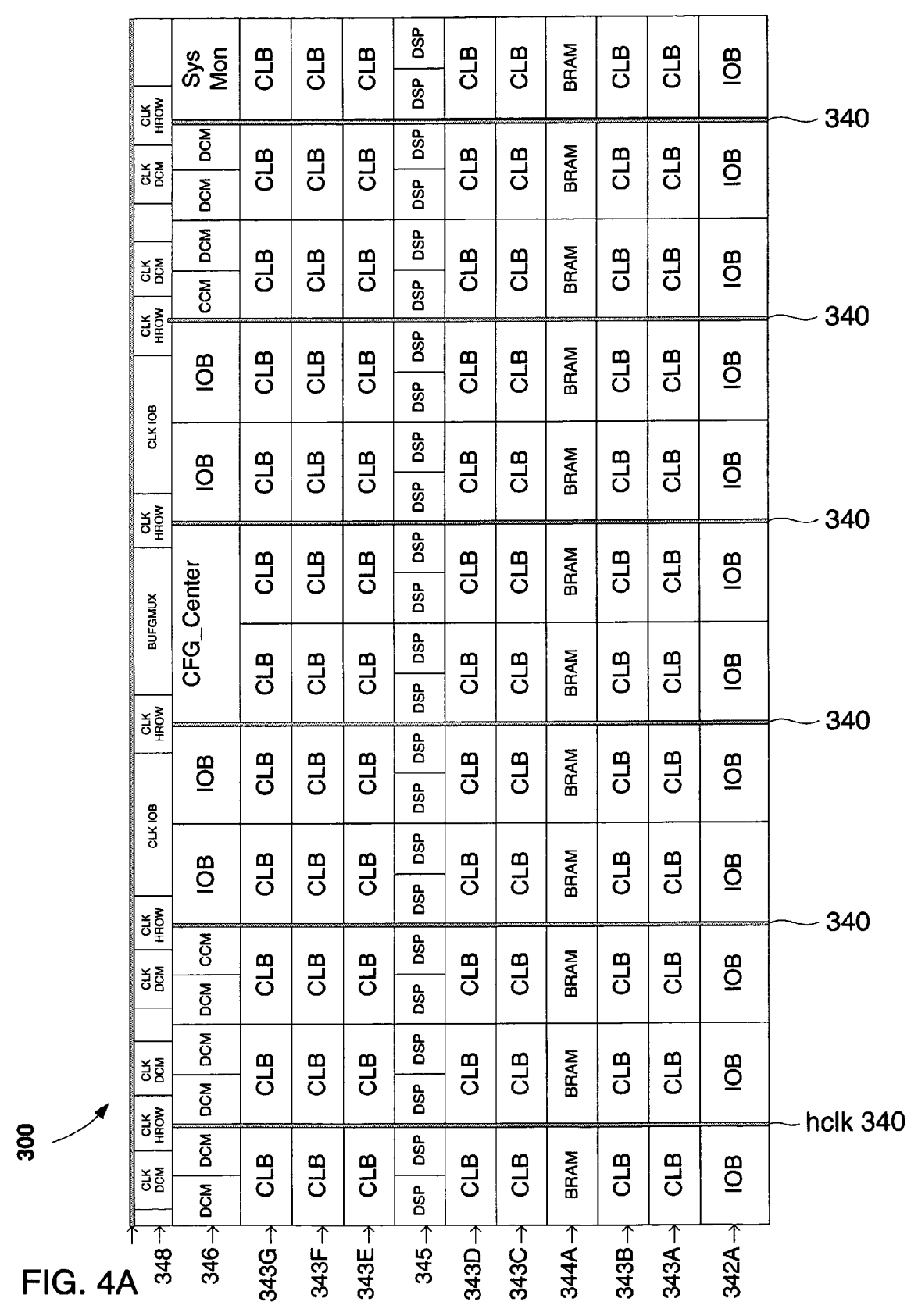

In order to better understand embodiments of the present invention an illustrative example of a columnar architecture is used (FIGS. 2, 3, and 4A/B).

Figure 1:
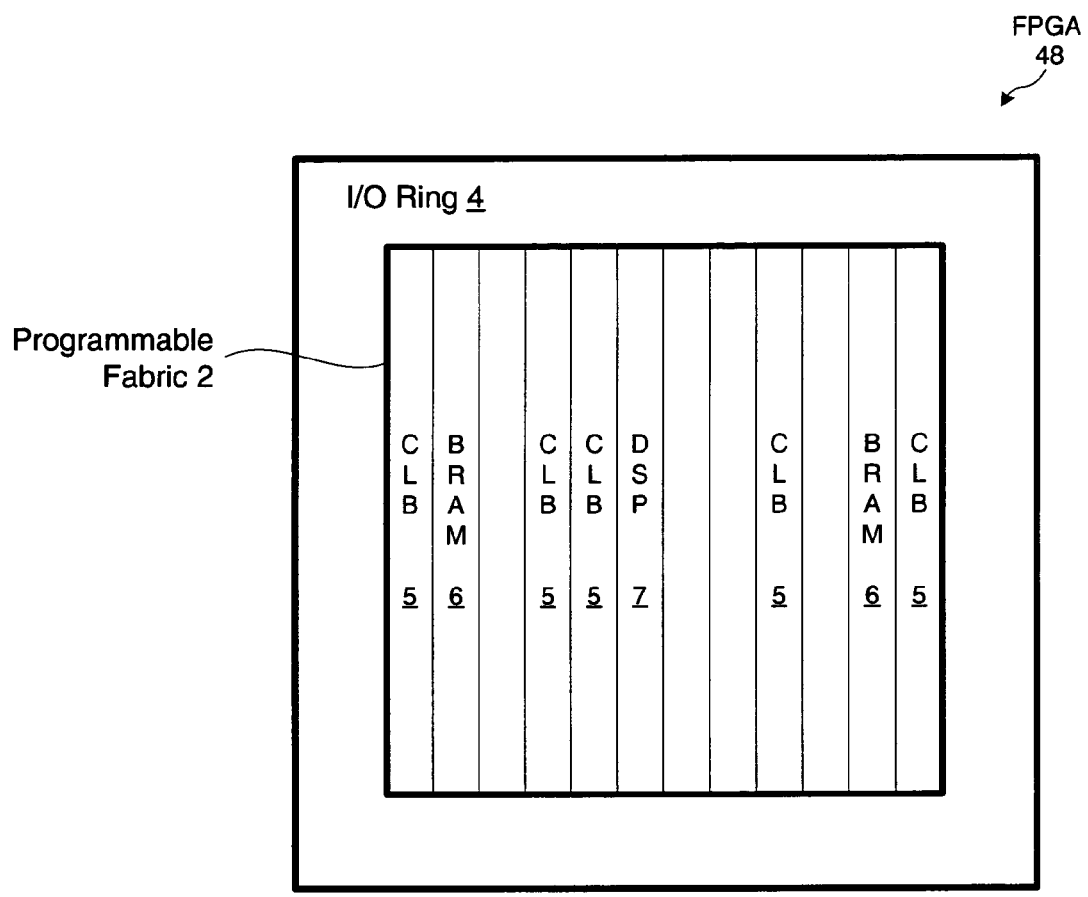
FIG. 1 is a simplified schematic view of a conventional FPGA (PRIOR ART)

FIG. 2 is a simplified diagram of IC 100 in accordance with one embodiment of the present invention. The IC includes two or more homogeneous columns, wherein each of the homogeneous columns starts at one side of the IC and ends at an opposite side of the IC. Each homogeneous column has substantially identical circuit elements substantially filling the column. IC 100 includes homogeneous columns 52, 58, and 64 of a CLB column type, homogeneous columns 54 and 68 of a BRAM column type, homogeneous columns 56 and 66 of an IOB column type, homogeneous column 62 of a DSP column type, and homogeneous column 70 of a MGT column type. Optionally, there is a heterogeneous column 60 (center col.) that may have circuit elements of different circuit types. One major difference between FIG. 2 and FIG. 1 is that FIG. 2 does not have an I/O ring 2. Note some embodiments of the present invention can be used for producing the FPGA 48 in FIG. 1 as well as for producing the IC 100 in FIG. 2.

FIG. 3 illustrates a FPGA architecture 200 of another embodiment of the present invention. FPGAs are a specific type of PLDs. Another example of a PLD includes a complex programmable logic device (CPLD). FPGA 200 has a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. This FPGA may also include dedicated processor blocks (PROC 210).

Each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA 200. The programmable interconnect element (INT 211) also includes the connections to and from the programmable logic element within the same tile, as shown by the examples included at the top of FIG. 3.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 3) is used for configuration, clock, and other control logic. Horizontal areas 209 extending from this column are used to distribute the clocks and configuration signals across the breadth of the FPGA.

The architecture illustrated in FIG. 3 includes additional logic blocks that disrupt the regular columnar structure making up a large part of the FPGA. The additional logic blocks can be programmable blocks and/or dedicated logic. For example, the processor block PROC 210 shown in FIG. 3 spans several columns of CLBs and BRAMs.

Note that FIG. 3 is intended to illustrate only an exemplary embodiment. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary.

A further description of the columnar architecture can be found in co-pending U.S. patent application Ser. No. 10/618,404 entitled "Columnar Floorplan", by Steven P. Young, filed Jul. 11, 2003 and U.S. patent application Ser. No. 10/683,944 entitled "Columnar Architecture", by Steven P. Young, filed Oct. 10, 2003, both of which are herein incorporated by reference.

Figure 4B:
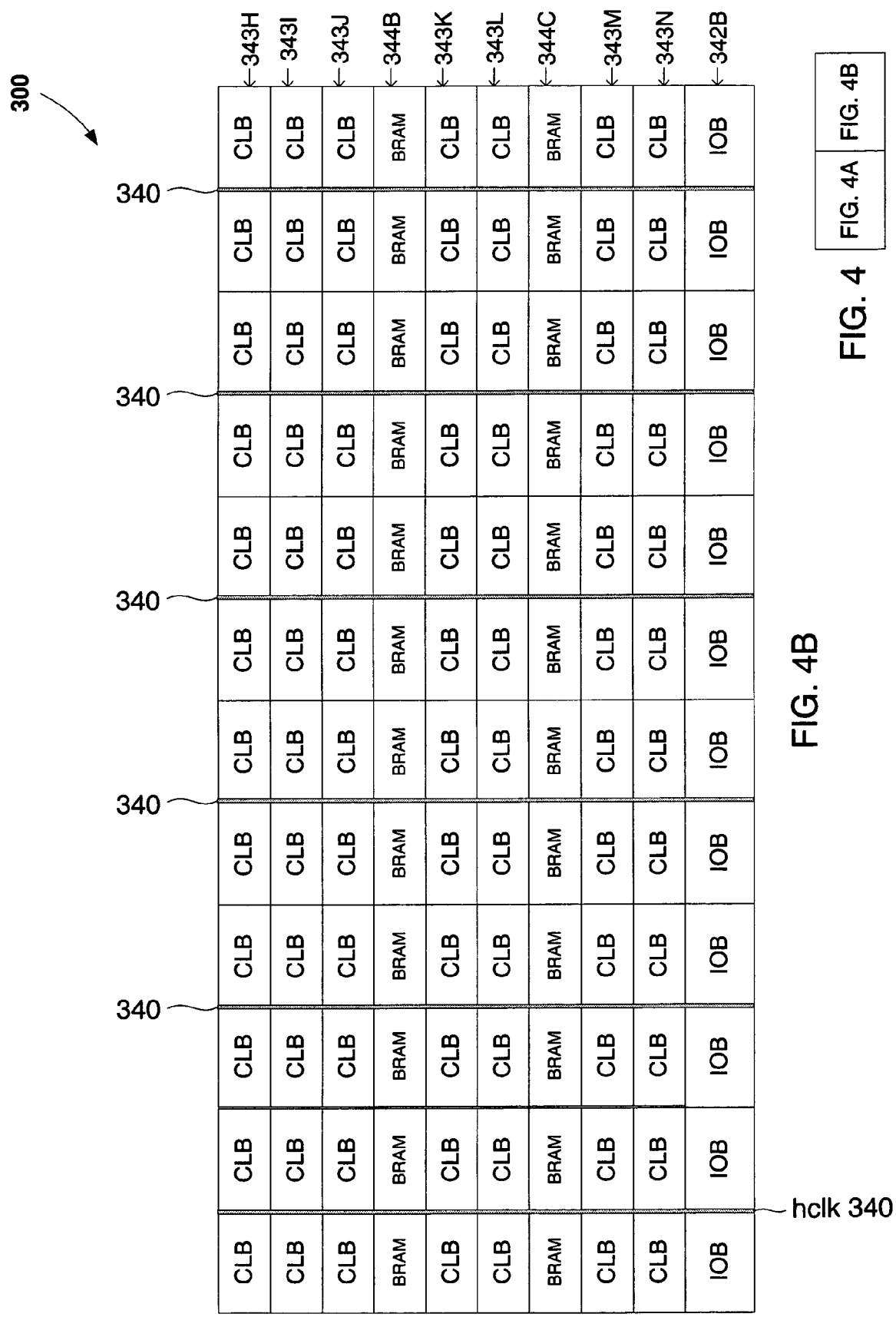

FIGS. 4A and 4B are simplified diagrams of a FPGA in accordance with another embodiment of the present invention. FIG. 4A shows a block diagram of the left side of the FPGA with the right side being shown in FIG. 4B. Note that the diagrams in FIGS. 4A and 4B are not to scale and that row 348 has been expanded to show the details.

In FIGS. 4A and 4B the horizontal hclk rows of a H clock tree are labeled by 340. Note that the term's row and column are for explanation purposes only and can be interchanged. The hclk rows are coupled to the backbone or main trunk 42 (gclk) of the H clock tree. Rows 342A (FIG. 4A) and 342B (FIG. 4B) each have 12 IOB groups, where each IOB group has 8 IOBs (or 16 IOLs, see FIG. 3). Rows 343A-343N each have 12 CLB groups, where from FIG. 3 each CLB group has 8 CLBs. Rows 344A-344C each have 12 BRAMs, where from FIG. 3 each BRAM has 2 BRLs. Row 345 has 24 DSP blocks.

Row 346 in FIG. 4A is the center column 60 of FIG. 2 and includes a plurality of heterogeneous elements, such as (from bottom to top) a System Monitor (Sys Mon) block, 3 DCM blocks, a CCM block, 2 IOBs, a CFG_center 20, 2 IOBS, a CCM block, and 5 DCM blocks. Row 348 is adjacent to row 346 and has the circuit blocks which interface the hclk rows 340 and the blocks in row 346 to the global clock tree backbone 42 (gclk).

FIGS. 5A-5C is a spreadsheet showing the high-level block placement for part of a FPGA of an embodiment of the present invention. FIGS. 5A-5C is the high-level placement specification for part of the associated FPGA 300 of FIGS. 4A-4B. Related columns in FIGS. 5A-5C have been given the same column reference numbers as in FIGS. 4A-4B. For example, a block label iob_iob16ta(1,2), includes 1 column and 2 rows, and represents two blocks 352-1 and 352-2, where each block has 4 IOBs (or 8 IOLs see FIG. 3). A block label clb8x2nb(1,2), includes 1 column and 2 rows, and represents two blocks 350-1 and 350-2, where each block has 4 CLBs 202 (see FIG. 3). A block label cfg_hclk_clbx2nb_left 353 is for one block in an hclk row of the H clock tree.

The high-level placement specification as illustrated by FIGS. 5A-C is then converted into a text file using, for example, the spreadsheet export option. Next, the text file is converted into an input text format (device.con), an example of which is the file 4vfx20.con in the Appendix.

Figure 6:
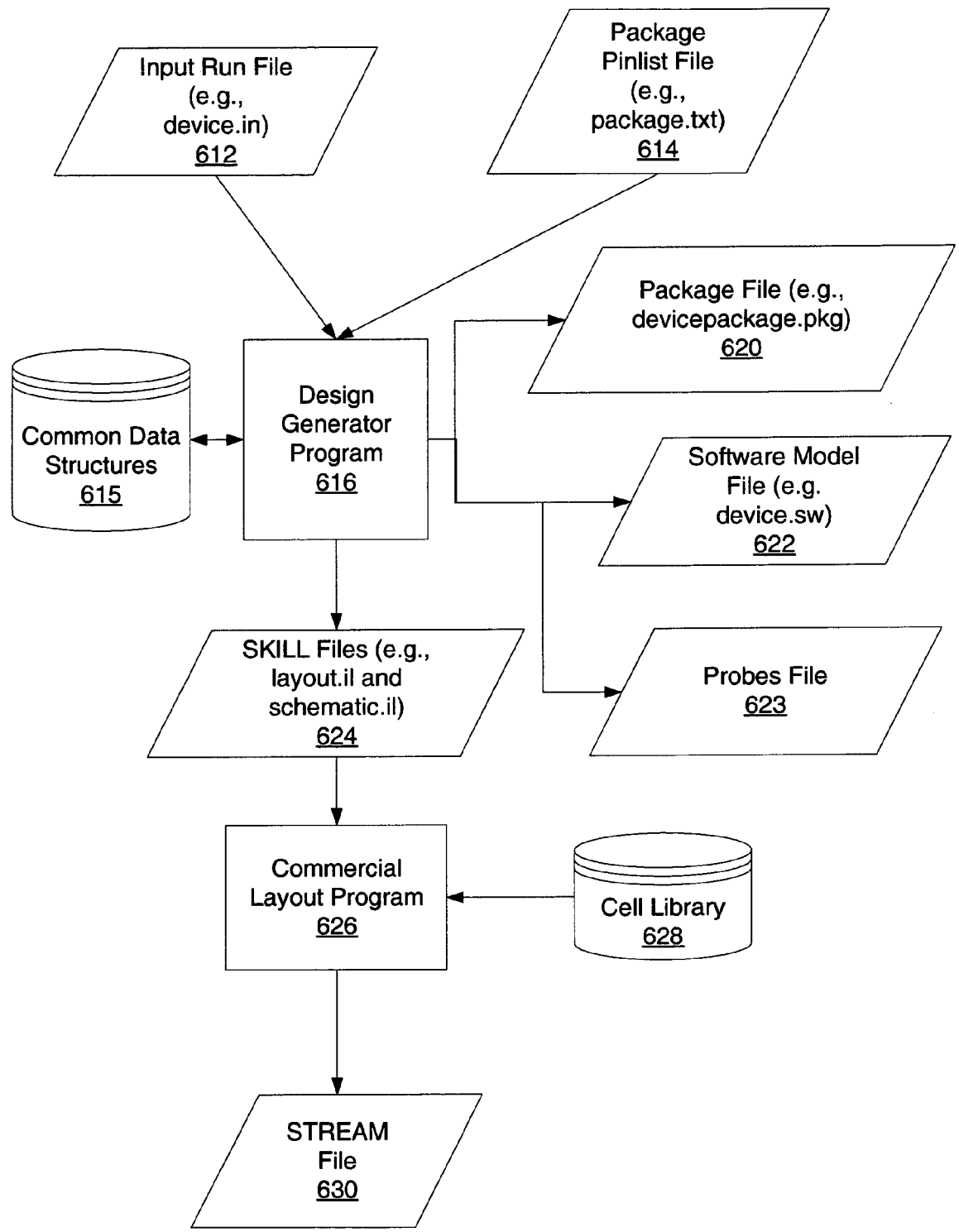
FIG. 6 is block diagram of a system of an embodiment of the present invention.

FIG. 6 is block diagram of a system of an embodiment of the present invention. The software program that converts the high-level placement specification to the SKILL files used by the Virtuoso custom design platform from Cadence Inc. is called the design generator program 616. The design generator program 616 is stored in a computer readable medium and is executed by a computer processor.

The design generator program 616 receives an input run file 612, e.g., device.in, which includes device.con (the high-level placement specification), and a package pin list file 614, e.g., package.txt. The design generator program 616 works in conjunction with common data structures 615 stored in a computer readable medium. The design generator program 616 outputs a package file 620, e.g., devicepackage.pkg, a software model file 622, e.g., device.sw, a probe file 623 having a listing of the probe coordinates used by test engineering, and a layout and a schematic SKILL file 624, e.g., layout.il and schematic.il. The SKILL files 624 are combined with a known cell library 628, e.g., a FPGA cell library, by a commercial layout program 626 to produce a STREAM file 630 for IC fabrication, as is well-known in the art.

Table 1 below describes in further detail the input files to the design generator program 616. Examples of these files for the 4vfx20 device along with an example of the design generator program 616 (dgen.c_excerpts.txt) are given in the Appendix, which is herein incorporated by reference.

TABLE 1

| Input Files | Description | Example in Appendix |
|---|---|---|
| Device Specific files: | | |
| Device.in | DesignGen run file | 4vfx20.in |
| Device.con | Device(s) construct file | 4vfx20.con |
| Package Specific files: | | |
| package.txt | Package pin mapping file | ff252.txt |
| package.combos | Device/package definition | 4vfx20.combos |
| inc_bank.limits | Device/package bank limits | inc_bank.limits |
| Family Specific Files: | | |
| inc_stats.define | Statistics definition file | inc_stats.define |
| inc_blocks.define | Block description file | inc_blocks.define |
| inc_addr.file | Address decode definition | inc_addr.file |
| inc_iob.options | IOB option cell placement | inc_iob.options |
| inc_block.offsets | Block special placement | inc_block.offsets |
| inc_bumps.file | Bump placement file | inc_bumps.file |

From Table 1 above, except for the package.txt file 614, the other input files are included in the input run file 612 device.in). An example input for the 4vfx20 device is:

/* 4vfx20.in file */
SkillLayFileName="4vfx20_lay.il" # Name of layout skill file generated.
SkillSchFileName="4vfx20_sch.il" # Name of schematic skill file generated.
SchLibName="wht_top" # Default schematic library name (used for all top schems).
LayLibName="wht_top" # Default layout library name (used for all top layouts).
Include "inc_blocks.define"
Include "4vfx20.con"
Include "inc_stats.define"
Include "inc_addr.file"
Include "inc_iob.options"
Include "4vfx20.combos"
Include "inc_bank.limits"
Include "inc_block.offsets"
Include "inc_bumps.file"

The outputs of the design generator program 616 are given in further detail in Table 2 below. Examples of these files for the 4vfx20 device are given in the Appendix, which is herein incorporated by reference.

TABLE 2

| Output file | Description | Example |
|---|---|---|
| Layout.il | Layout skill file | 4vfx20_lay.il |
| Schematic.il | Schematic skill file | 4vfx20_sch.il |
| Device.sw | Software File | 4vfx20.sw |
| DevicePackage.pkg | Package File | 4vlx20ff252.pkg |
| dgen.log | Stats & errors/warnings | none |

FIGS. 7A and 7B show two examples of common data structures 615 of an embodiment of the present invention. Other examples are shown in the "dgen.c_excerpts.txt" file in the Appendix. FIG. 7A is a C language type definition structure for a block (or cell). The data structure has an entry for the block name on the spreadsheet such as shown in FIGS. 5A-5C. There are also entries for both layout and schematic block placement data for the block. FIG. 7B is a C language type definition structure identifying the output data produced by the design generator program.

In another alternative embodiment of the present invention, the chip is divided up into rows and columns. At the intersection of a row and column a block or cell exists. All blocks in a column are initially allocated the same width (but not necessarily the same height). All blocks in a row are initially allocated the same height (but not necessarily the same width). This facilitates the exchange of one column with another column (or one row with another row). Megablocks (or mega-cells) which are wider and/or higher then one column or one row are allowed as long as they take up integer multiples of the corresponding blocks.

A block may consist of multiple circuit elements of the same type. For example, clb8x2nb(1,2) in column 343A of FIG. 5A consists of two blocks 350-1 and 350-2. Each block has four substantially identical CLBs 202 (see FIG. 3). Block 350-1 has the same width as block 350-2 as they are in the same column. Block 350-1 (CLB) has the same height as block 352-1 (IOB) as they are in the same row. These initial layout allocations of all blocks in a column having the same width and all blocks in a row having the same height, may be modified as a block in a particular row and column may be bigger than the initial layout allocation and may overlap with one or more adjacent rows/columns. For example, a block in an adjacent row and column may need to be offset to accommodate the oversized block. For example, the clk_hrow block 354 in FIG. 5C in column 348 is "2 clb's+hclk" tall, even though the height of the associated row is "hclk". The blocks placed above (e.g., block clk_dcm_top_u) and below (e.g., block clk_dcm_top_d) block 354 are then placed with an offset to account for the block 354 overlapping into their position.

Hence one embodiment of the present invention includes a system using a computer for laying out blocks from a specification. The system includes: a high level block placement specification stored in a computer readable medium having a description of a plurality of blocks arranged in rows and columns, wherein substantially all blocks in a row are initially allocated space of substantially equal height and substantially all blocks in a column are initially allocated space of substantially equal width; an offset specification (for example, inc_block_offsets.txt in the Appendix) stored in a computer readable medium having offsets for predetermined blocks of the plurality of blocks; and software (e.g., dgen.c) configured to lay out the plurality of blocks and to place one or more bumps on each selected block using the high level block placement specification and the offset specification. In one example, a particular predetermined block has an adjacent block whose height or width exceeds the initially allocated space for height or width for that adjacent block.

In another embodiment a block may consist of multiple circuits of the same type, e.g., IOB, but different sub-types. For example, iob_iob16ta(1,2), occupies two blocks 352-1 and 352-2. The 16 IOL 215 (see FIG. 3) circuits in the two blocks 352-1 and 352-2 can be individually specified in an inc_iob.options file, an example of which is given in the Appendix. A code snippet is shown below, where for example, MY indicates that the layout is flipped about the Y axis (the 1st coordinate is the layout, and the $2^{nd}$ coordinate is the schematic), R0 indicates that there is no rotation for the schematic cell placement, "lp" is one IOB subtype circuit ("iob_opt") and "ssp" another subtype circuit ("iob_opt_lc").

iob_cells={{"iob_iob16ta", MY(758.62, 818.4),

R0(58.1875, 67.5), lp, ln, lp, ln, lp, ln, lp, lnvr, lp,
ln, lp, ln, lp, ln, ssp, ssn}, . . .

Each block can have 4 addressable circuit elements. For example, there are 4 CLBs in a block. The base 4 address decoder circuitry, i.e., four address decoder circuits (one for each of the four addresses), e.g., addr_cells, can be automatically inserted in the hclk block, e.g., cfg_hclk_clbx2nb_left 353, for CLB block 350-1 (see FIG. 4A). There is also a second set of base 4 address decoder circuitry in cfg_hclk_clbx2nb_left 353, for CLB block 350-2. The placement of the two sets address decoder circuitry (where each set has four address decoder circuits) for blocks 350-1 and 350-2 is given in the file inc_addr.file, an example of which is given in the Appendix.

The address syntax is {"block_name", [(lay_address_offset1), (sch_address_offset1)], . . . } The address_offset1 specifies the x,y location of the 1st address placement relative to that block [(x,y) layout offset pair followed by (x,y) schematic offset pair). The address_offset2 specifies the start of the 2nd address placement and so forth. An example code snippet is:

{"cfg_hclk_clbx2nb_left", (0, 0), (7.625, hclk_sy-1),
(clb_$_{lx}$, 0), (16.625, hclk_sy-1)} where hclk_sy and clb_lx are variables given in the file inc_blocks.define (see Appendix for example). The example shows that two sets of address decoder circuitry will be placed. For the schematic, the first set has (x,y) offsets (0,0) and the second set has (x,y) offsets (clb_lx, 0). Similarly, (7.625, hclk_sy-1) and (16.625, hclk_sy-1) give the (x,y) offsets for the layout.

As can be seen in the above paragraph, there are 2 sets of address decoder instances, each with a specified x-offset and y-offset. In this example, each address decoder instance handles four address bits and has four address decoder circuits. These 2 instances are written left to right. An example of code illustrating the writing for a schematic of one address decoder instance is:

```
static void WriteSchAddrInst (
    . . .
) {
    (void) fprintf (file, "schCreateInst(cell %s \"%s\"
%.10g:%.10g \"R0\" 1)\n", name,
        AddrInstname( inst, ++data->addr_inst ),
        inst->sch_x + offset->x +
        data->addr_sch_spx*bits,
        inst->sch_y + offset->y
    );
}
``` where addr_sch_spx is a predetermined value giving the x spacing between address decoder instances for the schematic SKILL file and bits=3.

Figure 8:
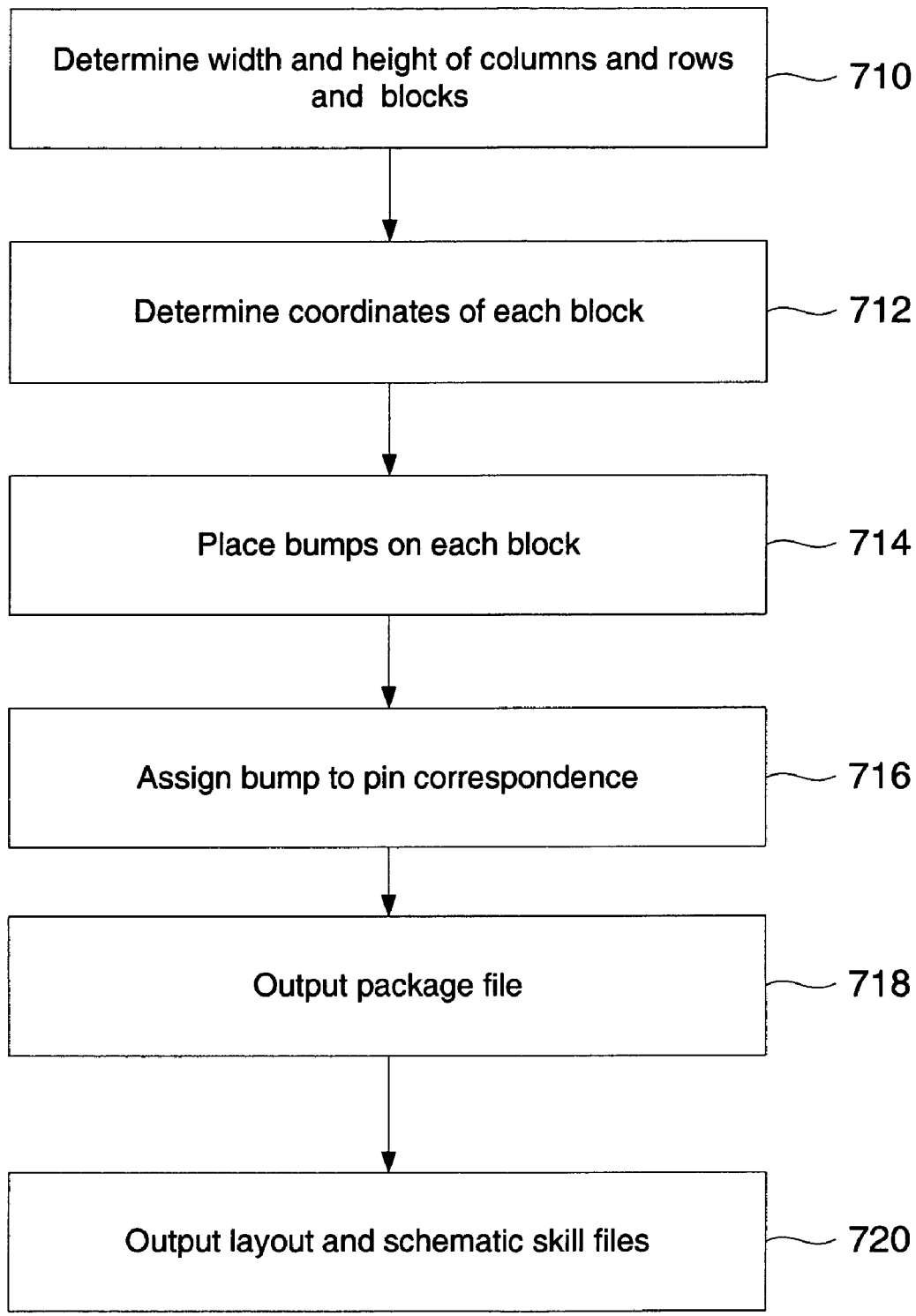
FIG. 8 is a flowchart for creating a package file and Cadence SKILL files for an integrated circuit of an embodiment of the present invention; Note that the Cadence® SKILL language is a high-level programming language, based on the LISP programming language but uses a C-like syntax. It is accessible only from within the Cadence software.

FIG. 8 is a flowchart for creating a package file and Cadence SKILL files for an integrated circuit of an embodiment of the present invention. At step 710 a grid of rows and columns, for example a spreadsheet, is formed and the width of each column and the height of each row are determined. A first column may (or may not) have a different width than a second column and a first row may (or may not) have a different height than a second row. The width and height for each block is determined. Next, at step 712, the coordinates for each block of the grid is determined. Then selecting, for example, an input/output block, one or more bumps are placed on the input/output block (step 714). Corresponding package pins are assigned to the one or more bumps (step 716). And the package file and layout and schematic SKILL files are output (steps 718 and 720, respectively).

The steps in FIG. 8 describing the functions of the design generator (dgen) program 616 (see FIG. 6) of one embodiment of the present invention are explained in greater detail below.

The "main" routine of the dgen.c program reads the input run file 612 and the package pinlist file 614 and produces the package file 620, software file 622 and SKILL files 624 of FIG. 6. An example main procedure is:

```
static int Main (
    int argc,
    char* argv [ ]
) {
    int result = 1;
    Logfile = FileOpen( stderr, Logfilename, "w" );
    PrintLogHeader( Logfile, argc, argv );
    if (Logfile) {
        data_p data = NewData ( );
        ReadData( data, *argv++ );
        while (--argc) {
            ReadPins( data, *argv++ );
        }
        MakeData( data );
        if( Debug == TRUE ) WriteTest( data, stdout );
        if( PrintProbes == TRUE ) {
            WriteProbes( data );
        } else {
            WriteData( data );
            PrintStats( data );
        }
        result = 0;
        FileClose( Logfile, Logfilename );
    }
    return result;
}
``` where two of the major routines of interest are MakeData and WriteData.

A pseudo code description for MakeData follows. MakeData in one embodiment performs steps 710 to 716 of FIG. 8.

```
static void MakeData (
    . . .
    /* Set layout lib/cell/view, width and height. */
    . . .
    /* Set schematic lib/cell/view, width and height. */
    . . .
    /* Check that all cells have both layout &
schematic definition. */
    . . .
    /* Add layout and schematic offsets to cells. */
    . . .
    /* Create part instance list. */
    wile (construct) {
        . . .
        InsertInst( part, inst );
        . . . }
    /* Add bumps to cell list. */
    . . .
    /* Create part package list. */
    . . .
    for( part = data->parts; part; part = part->next)
    {
        MakePart( part ); /* Create the bump instances
and match up pin names with bumps*/
        CheckPart( part ); /* Check that there is a
block for each row and column in the input part. Also
check that the width and height of each block matches
the reference width and height for that row and
column.*/
        Calcpart( part ); /* Calculate the block's
coordinates */
        SortBank( part ); /* Create banks to place the
blocks in */
        . . .
    }
}
```

Specifically at step 710 the design generator program 616 determines the width of each column for all columns, height of each row for all rows, and the height and width of all blocks. An output produced may be of the form:

part_name block_name col:row_num w/h_col/row_num where w/h_col/row_num (width and height of an intersection of a particular column and row number, col:row_num) is determined in the construct section (see below). Some code snippets illustrating this step are found in the routine MakeData (see Appendix). For the blocks section which assigns the width and height to a block name, the example snippet is:

```
static void MakeData (
    data_p data
) {
    . . .
    /* Set layout lib/cell/view, width and height. */
    for( block = data->lay_blocks; block; block =
block->next ) {
        cell = GetCell( data, block->name );
        cell->lay_lib = GetLayLib( data, block->lib );
        cell->lay_name = block->cell ? block->cell :
block->name;
        cell ->lay_view = block->view ? block->view :
"layout";
        cell->lay_mirror = block->mirror;
        cell->lay_width = block->width;
        cell->lay_height = block->height;
        if (block->cell2) {
            cell ->lay_lib2 =
                block->lib2 ? GetLayLib( data, block->
                lib2 ):
cell ->lay_lib;
            cell->lay_name2 = block->cell2;
            cell->lay_view2 = block->view ? block -
                >view :
"layout";
            cell->lay_mirror2 = block->mirror2;
        }
    }
    /* Set schematic lib/cell/view, width and height.
*/
    for( block = data->sch_blocks; block; block =
block->next ) {
        cell = GetCell( data, block->name );
        cell->sch_lib = GetSchLib( data, block->lib );
        cell->sch_name - block->cell ? block->cell :
block->name;
        cell ->sch_view = block->view ? block->view :
"symbol";
        cell ->sch_mirror = block->mirror;
        cell->sch_width = block->width;
        cell->sch_height = block->height;
    }
    . . .
```

The construct section code snippet of MakeData which ties in part name, col:row_num, w/h_col/row_num to the block name is:

```
static void MakeData (
        data_p data
) {
    ...
    /* Create part instance list. */
    while (construct) {
        part = GetPart( data, construct->part_name );
        cell = FindCell( data->cells, construct->block_name );
        if (cell) {
            cell->cols = GetCols( data, cell->name, construct->cols );
            cell->rows = GetRows( data, cell->name, construct->rows );
            for( col = construct->col; col; col = col->next ) {
                for( row = construct->row; row; row = row->next ) {
                    inst = NewInst( part->insts_lrtb );
                    inst->col = col->pos;
                    inst->row = row->pos;
                    inst->cell = cell;
                    inst->lay_mirror = CalcMirror(
                        construct->mirror, cell ? cell->lay_mirror : R0
                    );
                    inst->lay_mirror2 = CalcMirror(
                        construct->mirror, cell ? cell->lay_mirror2 : R0
                    );
                    inst->sch_mirror = CalcMirror(
                        construct->mirror, cell ? cell->sch_mirror : R0
                    );
                    inst->banknum_exists = construct->banknum_exists;
                    inst->banknum = construct->banknum;
                    inst->order_exists = construct->order_exists;
                    inst->order = construct->order;
                    if (cell) part->insts_lrtb = inst;
                    if (IsMegaBlock (cell)) cell = NULL;
                    if (part>cols < inst->col) part->cols = inst->col;
                    if (part->rows < inst->row) part->rows = inst->row;
                    InsertInst( part, inst );
                }
            }
        } else {
            ...
            );
        }
        construct = construct->next;
    }
    ...
```

The routine InsertInst(part, inst) in the construct section above that sets w/h_col/row_num, i.e., col/row width/height, has the following code snippet:

```
static void InsertInst (
        part_p part,
        inst_p inst
) {
    ...
    /* Set the col/row width/height (except for megacell placeholders). */
    if (cell) {
        if (cell->cols == 1) {
            if ( (*refcolp)->val_set ) {...;
            } else {
                (*refcolp)->val_set = TRUE;
                (*refcolp)->lay_val = cell->lay_width;
                (*refcolp)->sch_val = cell->sch_width;
```
```
                (*refcolp)->inst = inst;
            }
        } else {
            if ( (*refcolp)->lay_mega == 0.0) {
                (*refcolp)->number = cell->cols;
                (*refcolp)->lay_mega = cell->lay_width;
            }
            if ((*refcolp)->sch_mega == 0.0) {
                (*refcolp)->number = cell->cols;
                (*refcolp)->sch_mega = cell->sch_width;
            }
        }
        if (cell->rows == 1) {
            if ( (*refrowp)->val_set) {...;
            } else {
                (*refrowp)->val_set = TRUE;
                (*refrowp)->lay_val = cell->lay_height;
                (*refrowp)->sch_val = cell->sch_height;
                (*refrowp)->inst = inst;
            }
        } else {
            if ((*refrowp)->lay_mega == 0.0) {
                (*refrowp)->number = cell->rows;
                (*refrowp)->lay_mega = cell->lay_height;
            }
            if ((*refrowp)->sch_mega == 0.0) {
                (*refrowp)->number = cell->rows;
                (*refrowp)->sch_mega = cell->sch_height;
            }
        }
    }
    inst->refcol = *refcolp;
    inst->refrow = *refrowp;
    ...
```

In an alternative embodiment step 714 is done before step 712 in FIG. 8. Step 714 places one or more bumps on each of selected blocks (normally not all blocks have bumps). All blocks with the same name get the same bumps. Which bumps go with which blocks is set by the inc_bumps.file, a sample of which is given in the Appendix, along with the name of the block. Bump positions (x,y) on a block are determined by adding the respective bump offset with the coordinates of the block placement (the calculation of the bumps x,y coordinates can be done by the CalcPart routine, a sample of which is given in the Appendix). An output of this step can be of the form:

part_name block_name col_num:row_num bump_name bump_type (x,y) priority where the priority is a numerical reference starting with "1" and incrementing to higher integer values.

In order to improve bump placement on a block a template system is used by an embodiment of the present invention. In the bumps specification file, for example inc_bumps.file, which block names on the spreadsheet, e.g., iob_iob16ta 352-1 and 352-2 of FIG. 4A, and the associate template is first given. The bump allocation template syntax is:

<template_name   block_name   variable=start_number, variable=start_number, . . . > where an example is:

Bump_Allocation={

<iob16_1 iob_iob16ta q=1>

<iob16_1 iob_iob16_smta q=1, s=1>

<iob16_1 iob_iob16tb q=9>

. . . }

The bump allocation template which assigns the bumps to the block has syntax:

{<template_name argname1 argname2 . . . >
{"bump_name" bump_type bump_offset &block_name <dir>}} where a partial example for the template iob16_1 (with 16 iob_cells) is:

Templates={
{<iob16_1 block_name q s>
{"GND" gnd iob16_07a_offset_1 (probe iob_07a_probe_1) &block_name inoutID},
{"VCCO" vcco iob16_06a_offset_1 (probe iob_06a_probe_1) &block_name inoutID},
{io_cell_1 (n=q, n3=s) bump_io iob16_05a_offset_1 &block_name inoutID},
{io_cell_2 (n=q, n3=s) bump_io iob16_04a_offset_1 &block_name inoutID},
{io_cell_3 (n=q+1, n3=s+1) bump_io iob16_03a_offset_1 (probe iob_03a_probe_1) &block_name inoutID},
. . . .
{io_cell_16 (n=q+7, n3=s+6) bump_io iob16_01d_offset_1 &block_name inoutID}, }, . . . }

The code snippet illustrating step 714 of placing bumps on each block is:

```
static void MakeData (
        data_p data
) {
        . . .
        /* Add bumps to cell list. */
        while (bumpalloc) {
            cell = FindCell( data->cells, bumpalloc->block_name );
                if (cell) {
                    bump = NewBump( cell->bumps );
                    bump->name = bumpalloc->bump_name;
                    bump->direction = bumpalloc->direction;
                    bump->type = GetBump( data, bumpalloc->bump_type );
                    bump_offset = FindOffset( bump_offsets, bumpalloc->bump_offset );
                    if (bump_offset) {
                        bump->lay_xoff = bump_offset->lay_x;
                        bump->lay_yoff = bump_offset->lay_y;
                        bump->sch_coord = bump_offset->sch_coord;
                        bump->sch_xoff = bump_offset->sch_x;
                        bump->sch_yoff = bump_offset->sch_y;
                    } else {
                        . . .
                        ) ;
                    }
                    if (bumpalloc->probe_type) {
                        bump->probe = GetBump( data, bumpalloc->probe_type );
                        bump_offset = FindOffset (bump_offsets,bumpalloc->probe_offset);
                        if (bump_offset) {
                            bump->probe_xoff = bump_offset->lay_x;
                            bump->probe_yoff = bump_offset->lay_y;
                        } else {
                            . . .
                        );
                        }
                    }
                    cell->bumps = bump;
                    . . .
        }
}
```

Returning to step 712 the block placement coordinates are determined. The center of each row, column intersection is determined and an inputted x,y offset is used to determine the block placement. This step produces output of the form:

part_name block_name col_num:row_num col_num_cntr, row_num_cntr (x,y)

where col/row_num_cntr is determined by adding the previous col/row center with ½ the current col/row width/height and ½ the previous col/row width/height. The general equations for the col/row using an integer N as the current col or row number is;

$$\text{col\_}N\text{\_cntr} = \text{col\_}N\text{-1\_cntr} + \tfrac{1}{2}(w\text{\_col\_}N + w\text{\_col\_}N\text{-}1)$$

$$\text{row\_}N\text{\_cntr} = \text{row\_}N\text{-1\_cntr} + \tfrac{1}{2}(h\text{\_row\_}N + h\text{\_row\_}N\text{-}1)$$

For these equations the w/h and cntr of the col/row before N=1 all equal 0.

$$\text{col\_0\_cntr} = 0$$

$$\text{row\_0\_cntr} = 0$$

$$w\text{\_col\_0} = 0$$

$$h\text{\_row\_0} = 0$$

The (x,y) coordinates for a block are the col and row centers modified for any block offsets, i.e., $$x = \text{col\_}N\text{\_cntr} + \text{offset}$$

$$y = \text{row\_}N\text{\_cntr} + \text{offset}$$

An example of code which performs step 712 is given from part of the CalcPart routine:

```
static void CalcPart (
        part_p part
) {
        . . .
                /* Calculate reference column coordinates. */
                while (refcol) {
                    lay_x += (lay_width + refcol->lay_val)/2.0;
                    lay_width = refcol->lay_val;
                    refcol->lay_ctr = lay_x;
                    sch_x += (sch width + refcol->sch_val)/2.0;
                    sch_width = refcol->sch_val;
                    refcol->sch_ctr = sch_x;
                    part_width += refcol->lay_val;
                    refcol = refcol->next;
                }
                part->width = part_width;
                /* Go to the last row (in order to start at coordinate 0,0). */
                if( refrow ) {
                    while( refrow->next ) refrow = refrow->next;
                }
                /* Calculate reference row coordinates. */
                while (refrow) {
                    lay_y += (lay_height + refrow->lay_val)/2.0;
                    lay_height = refrow->lay_val;
                    refrow->lay_ctr = lay_y;
                    sch_y += (sch_height + refrow->sch_val)/2.0;
                    sch_height = refrow->sch_val;
                    refrow->sch_ctr = sch_y;
                    part_height += refrow->lay_val;
                    refrow = refrow->prev;
                {
                part->height = part_height;
                /* Calculate inst , e.g., block, coordinates
(including any mirror & offsets). */
                while (inst) {
                    lay_mirror = inst->lay_mirror;
```

```
            sch_mirror = inst->sch_mirror;
            lay_width = inst->cell->lay_width;
            lay_height = inst->cell->lay_height;
            sch_width = inst->cell->sch_width;
            sch_height = inst->cell->sch_height;
            lay_x = inst->refcol->lay_ctr;
            lay_y = inst->refrow->lay_ctr;
            sch_x = inst->refcol->sch_ctr;
            sch_y = inst->refrow->sch_ctr;
            /* Change from ref col/row center to mega block
center. */
            if (IsMegaBlock( inst->cell)) {
                    lay_x += (inst->cell->lay_width - inst-
>refcol->lay_val) /2.0;
                    lay_y -= (inst->cell->lay_height - inst-
>refrow->lay_val) /2.0;
                    sch_x += (inst->cell->sch_width - inst-
>refcol->sch_val) /2 .0;
                    sch_y -= (inst->cell->sch_height - inst-
>refrow->sch_val) /2 .0;
            }
            inst->lay_x_ctr = lay_x;
            inst->lay_y_ctr = lay_y;
            inst->sch_x_ctr = sch_x;
            inst->sch_y_ctr = sch_y;
            /* Now adjust for lower left origin and mirror. */
            inst->lay_x = lay_x -
XMirror(lay_mirror,lay_width/2.0, lay_height/2.0);
            inst->lay_y = lay_y -
YMirror(lay_mirror,lay_width/2.0, lay_height/2.0);
            inst->sch_x = sch_x -
XMirror(sch_mirror,sch_width/2.0,sch_height/2.0);
            inst->sch_y = sch_y -
YMirror(sch_mirror,sch_width/2.0,sch_height/2.0);
            /* Now adjust for any offset and chip centering.
*/
            inst->lay_x += inst->cell->lay_xoff -
part_width/2.0;
            inst->sch_x += inst->cell->sch_xoff;
            inst->lay_y += inst->cell->lay_yoff -
part_height/2.0;
            inst->sch_y += inst->cell->sch_yoff;
    . . . }
```

There may be a step 715 between steps 714 and 716 (not shown in FIG. 8). Step 715 would include assigning bump numbers. This step assigns unique numbers to each bank of multi-gigabit (MGT) blocks and serial I/O (SIO) blocks. The unique numbers are assigned numerically starting in the top left and increasing top to bottom/left to right. It also assigns unique PAD numbers for each I/O in the SIO blocks, again starting in the top left and increasing top to bottom/left to right. Example code to assign Pad numbers is given in the SetPadTBLR(part) routine called from the MakePart routine (see the Appendix):

```
static void SetPadTBLR (
    part_p part
) {
    int pad_num = 0;
    bumpinst_p bumpinst = NULL;
    inst_p inst = part->insts_tblr;
    while (inst) {
        if (inst->cell && StringEqualnIC( inst->cell-
>name, "io")) {
            bumpinst = inst->bumpinsts;
            while (bumpinst) {
if (StringEqualnIC( bumpinst->bump->name, "io")) {
                    bumpinst->pad_num = ++pad_num;
                }
                bumpinst = bumpinst->next;
            }
        }
```
```
        inst = inst->next_tblr;
    }
}
```

Step 716 of FIG. 8 assigns pin numbers to bumps (if applicable). The part_name and associated pkg_name is input from the combos file, e.g., 4vfx20.combos file in the Appendix (which has, for example, {part_name, pkg_name}={"4vfx20", "ff252"}). The pin_label is derived from the package pinlist file (package.txt), for example, ff252.txt in the Appendix. If there are more pin_label's then io bumps then the bump_type is listed as "NOPAD". If there are more bump_name's then pin_label's, then the corresponding pin_label is listed as "UNBONDED". An example of a routine that produces the output format: {part_name pkg_name block_name col_num:row_num bump_name bump_type sio/mgt_num (X, Y) pin_label} is:

```
    (void) fprintf (file, "\nSection V.\n");
    for (part = data->parts; part; part = part->next) {
        for( pkgs = part->pkgs; pkgs; pkgs = pkgs->next )
{
            for (bank = part->banks; bank; bank = bank-
>next) {
                banknum =bank->banknum;
                banklimit = BankLimit( data, part, pkgs->pkg,
banknum );
                banklimitnum = banklimit ? banklimit->banklimit :
0;
                pin = FindBankPins( pkgs->pkg->bank_pins, banknum
) ;
                for( inst = bank->insts; inst; inst = inst-
>next_bank ) {
                    for( bumpinst = inst->bumpinsts;
bumpinst;
                        bumpinst = bumpinst->next
                    ) {
                        if (banklimitnum && pin) {
                            --banklimitnum;
                            name = pin->name;
                            pin = pin->next;
                        } else {
                            name = "UNBONDED";
                        }
                        (void) fprintf (file,
 " %-8s %-6s %-6s %4g:%-4g %12s %10s
%3d (%5g, %5g) %s\n",
                            part->name, pkgs->pkg->name, inst->cell-
>name,
                            inst->col, inst->row,
                            bumpinst->bump->name,
                            bumpinst->bump->type-
>name,
                            inst->banknum,
                            inst->lay_x + bumpinst->bump-
>lay_xoff,
                            inst->lay_y + bumpinst->bump-
>lay_yoff,
                            name
                        ) ;
                    }
                }
                while (pin) {
                    (void) fprintf (file," %-8s %-6s %10s
%s\n",
                        part->name, pkgs->pkg->name,
                        "NOPAD",
```

```
                        name
                                );
                                pin = pin->next;
                            }
                        }
                    }
                }
```

In another embodiment Steps 716 and 718 are combined and the WritePkg routine, an example of which is in the Appendix, both assigns the pin numbers to the bumps (step 716) and outputs a package file, e.g., devicepackage.pkg, such as 4vfx20 ff252.pkg in the Appendix. WritePkg produces data of the following format:

bump_type bump_name pin_label bank_num Pin_Descrip (x,y)

Step 720 outputs the layout and schematic SKILL files. This step creates the skill file (layout.il), for example, 4vfx20_lay.il in the Appendix, that when loaded into the Virtuoso tool from Cadence, Inc., creates the layout for the part. Instances are placed for each block and each bump. Labels are placed for each bump. This step also creates the skill file (schems.il), for example, 4vfx20_sch.il in the Appendix, that when loaded into Virtuoso creates the schematic for each of the parts. Instances are placed for each block and pins are placed for each bump.

In yet another embodiment of the present invention, the common data structures 615 in FIG. 6 that are created by the design generator program form a master data file (or database), that can be used to produce multiple views of an IC design and in particular a columnar architecture IC design.

Figure 9:
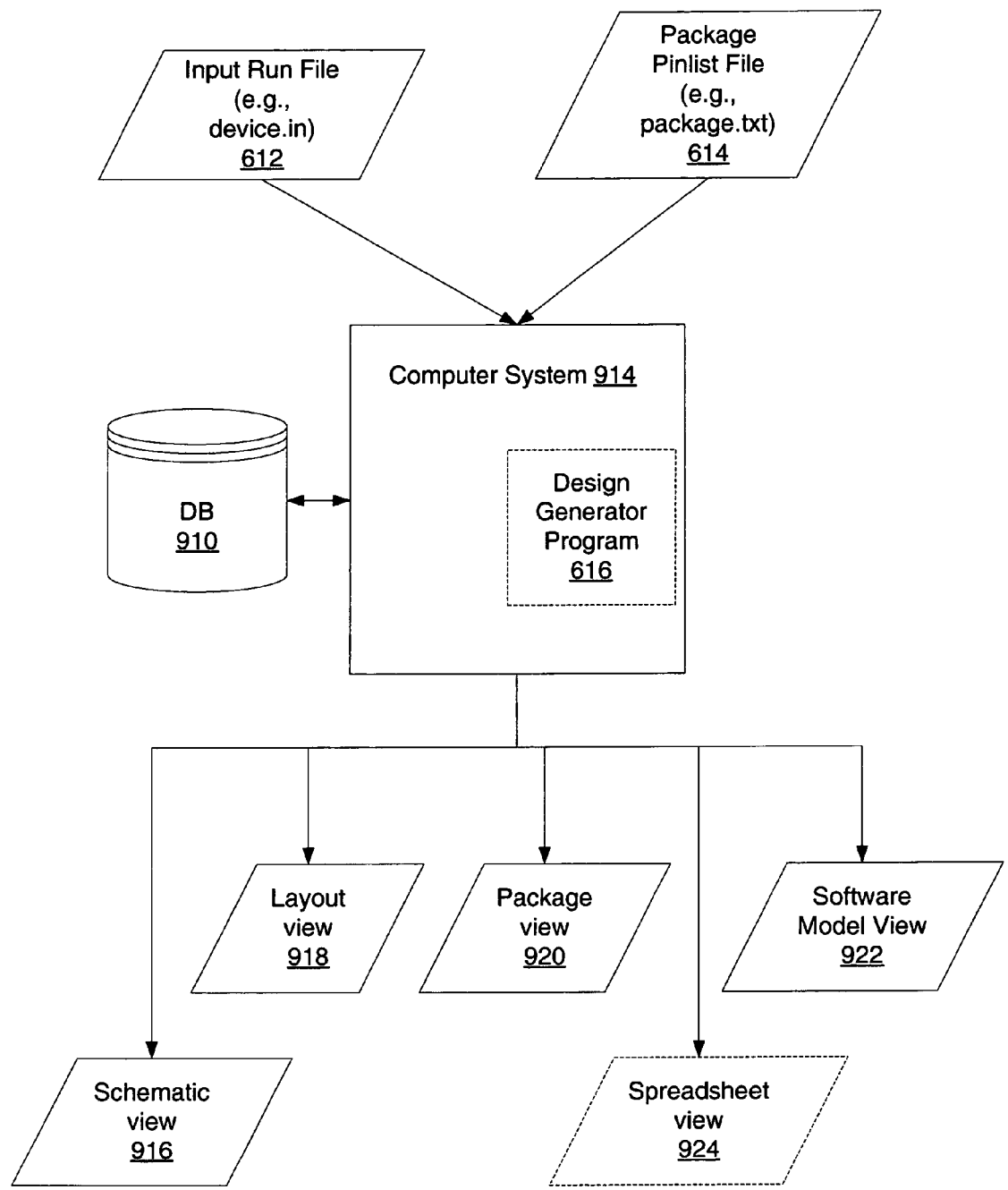
FIG. 9 is a block diagram of a system using a master database to produce multiple views of a columnar architecture design of an embodiment of the present invention.

FIG. 9 is a block diagram of a system using a database 910 to produce multiple views of a columnar architecture design of an embodiment of the present invention. A computer system 914 receives an input run file 612 having the high level description of the IC, e.g., a spreadsheet, and a package pin list file 614. The computer system 914 has a design generator program 616 (see FIG. 6) that populates a plurality of common data structures (for example, those shown in FIGS. 7A and 7B and in the dgen.c_excerpts.txt file in the Appendix), where the plurality of common data structures form part of the DB 910. The computer system 914 can then access the DB 910 to produce multiple views of the columnar architecture design. The views include a schematic view 916, a layout view 918, a package view 920 and a software model view 922. Each of these views may be represented by a data file (for example, SKILL files in the case of the layout and schematic views) or may be displayed on a computer screen or both. In an alternative embodiment the input spreadsheet view 924 is optionally output.

While the above functionality has generally been described in terms of specific hardware and software, it would be recognized that the invention has a much broader range of applicability. For example, the software functionality can be further combined or even separated.

Similarly, the hardware functionality can be further combined, or even separated. The software functionality can be implemented in terms of hardware or a combination of hardware and software. Similarly, the hardware functionality can be implemented in software or a combination of hardware and software.

Although the invention has been described in connection with several embodiments, it is understood that this invention is not limited to the embodiments disclosed, but is capable of various modifications, which would be apparent to one of ordinary skill in the art. For example, although only one processor is shown on FPGA 200 of FIG. 3, it is understood that more than one processor or even another ASIC may be present in other embodiments. Thus, the invention is limited only by the following claims.

What is claimed is:

1. A system for laying out blocks, in a programmable integrated circuit, from a specification, comprising:
   a computer having a computer-readable storage medium, an input and an output;
   a high level block placement specification stored in the computer-readable storage medium comprising a description of a plurality of blocks arranged in rows and columns, wherein most blocks in a row are of substantially equal height and most blocks in a column are of substantially equal width;
   a bump placement specification stored in the computer readable medium for selected blocks of the plurality of blocks; and
   software stored on the computer readable medium and configured to lay out the plurality of blocks and to place one or more bumps on each selected block using the high level block placement specification and the bump placement specification and to present the resulting layout in the output.

2. The system of claim 1 wherein the high level block placement specification comprises a spreadsheet.

3. The system of claim 1 wherein the selected blocks of the plurality of blocks are selected from a set of blocks including serial input/output (SIO) blocks.

4. The system of claim 3 wherein the set of blocks further includes multi-gigabit (MGT) blocks, and blocks associated with an embedded processor.

5. The system of claim 1 further comprising package pin mapping information, and wherein the software is further configured to map the one or more bumps to an appropriate pin in the package pin mapping information.

6. The system of claim 1 wherein the height and width of each of the blocks is determined using a blocks definition file.

7. The system of claim 6 wherein the blocks definition file has an algebraic equation for determining a height and a width value of a block.

8. The system of claim 7 wherein the placement of each block depends on offset information, the offset information including algebraic equations having variables defined in the blocks definition file wherein the variables represent physical location data.

9. The system of claim 1 wherein the bump placement specification comprises bump offset data stored in a file.

10. The system of claim 1 further comprising address decode information for a block of the plurality of blocks, wherein the software is further configured to decode the address information to generate address decode circuitry for the block.

11. The system of claim 10 wherein the address decode information comprises offset data for the address decode circuitry.

12. The system of claim 1 further comprising stored block optioning information for a selected block of the plurality of blocks, wherein the software is further configured to generate various circuits for the selected block depending on the stored block optioning information.

13. The system of claim 12 wherein the block optioning information comprises a plurality of input/output circuit sub-types.

14. The system of claim 1 wherein the software is further configured to generate schematic and layout SKILL files.

15. The system of claim 1 wherein the software is further configured to generate a package file for a device.

16. The system of claim 1 wherein the bump placement specification comprises bump offset data for a selected block.

17. The system of claim 1 wherein the bump placement specification comprises a bump allocation template for a selected block.

18. The system of claim 1 wherein the software is further configured to generate a software model file.

* * * * *